(12) United States Patent
Tsukada et al.

(10) Patent No.: US 6,715,204 B1
(45) Date of Patent: Apr. 6, 2004

(54) PRINTED WIRING BOARD AND METHOD FOR PRODUCING THE SAME

(75) Inventors: Kiyotaka Tsukada, Ogaki (JP); Masaru Takada, Ogaki (JP); Kenji Chihara, Ogaki (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/720,953

(22) PCT Filed: Jul. 7, 1999

(86) PCT No.: PCT/JP99/03664

§ 371 (c)(1),
(2), (4) Date: Feb. 13, 2001

(87) PCT Pub. No.: WO00/03572

PCT Pub. Date: Jan. 20, 2000

(30) Foreign Application Priority Data

Jul. 8, 1998 (JP) ............................. 10/192992

(51) Int. Cl.⁷ .................................. H05K 3/02
(52) U.S. Cl. .............................. 29/847; 29/852; 29/853
(58) Field of Search ................... 174/250, 254; 29/847, 852, 853

(56) References Cited

U.S. PATENT DOCUMENTS

| | | | |
|---|---|---|---|
| 4,964,212 A | * | 10/1990 | Deroux-Dauphin et al. .. 29/852 |
| 6,021,564 A | * | 2/2000 | Hanson ....................... 29/852 |
| 6,346,678 B1 | * | 2/2002 | Kono et al. .................. 174/255 |

FOREIGN PATENT DOCUMENTS

| | | |
|---|---|---|
| JP | 61-176193 | 8/1986 |
| JP | 3-129795 | 6/1991 |
| JP | 5-200574 | 8/1993 |
| JP | 9-046042 | 2/1997 |
| JP | 9-148698 | 6/1997 |

* cited by examiner

Primary Examiner—Kamand Cuneo
Assistant Examiner—Jeremy Norris
(74) Attorney, Agent, or Firm—Boyle Fredrickson Newholm Stein & Gratz S.C.

(57) ABSTRACT

A printed circuit board and a method for manufacturing the same that facilitates the formation of an upper surface pattern and prevents a lower surface metal foil from being damaged when forming a blind via hole with a laser. A lower surface and an upper surface of an insulative substrate (5) are respectively coated with a lower surface metal foil (220) and an upper surface metal foil (210), the thickness of which is less than that of the lower surface metal foil (220). Next, an opening (213) is formed in the upper surface metal foil at a location corresponding to a blind via hole formation portion (35) of the insulative substrate. A blind via hole (3), the bottom of which is the lower surface metal foil, is formed by emitting a laser (8) against the blind via hole formation portion (35) through the opening (213). Then, a metal plating film (23) is applied to the wall of the blind via hole (3), and an upper surface pattern (21) and a lower surface pattern (22) are formed through etching.

12 Claims, 5 Drawing Sheets

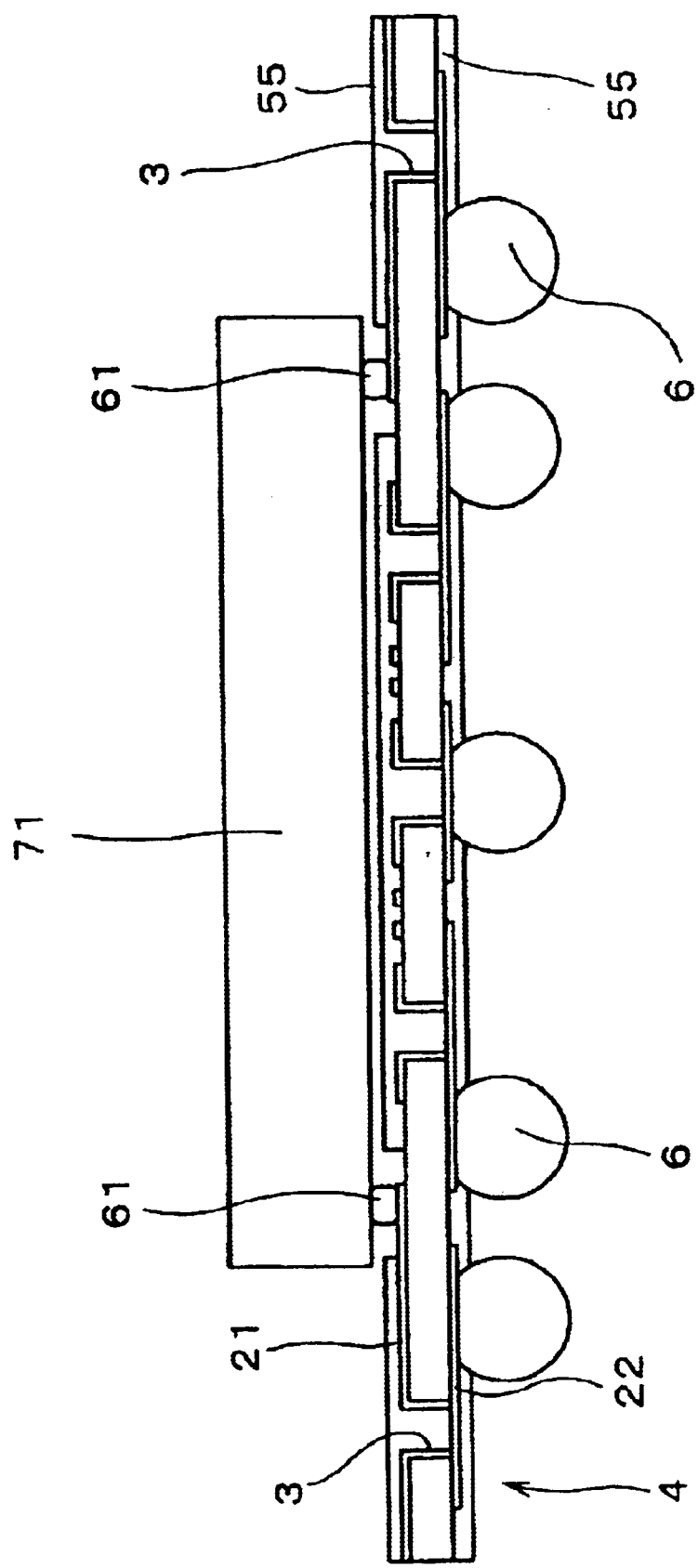

PRINTED WIRING BOARD AND METHOD FOR PRODUCING THE SAME

BACKGROUND OF THE INVENTION

The present invention relates to a printed circuit board and a method of manufacturing same, and more particularly, to the formation of a pattern and the formation of a blind via hole on a printed circuit board.

In the prior art, a printed circuit board includes an insulative substrate having an upper surface on which an upper surface pattern is formed and a lower surface on which a lower surface pattern is formed, and blind via holes for electrically connecting the upper and lower surface patterns. Due to the recent trend of greater integration, a blind via hole is formed by a laser so that it has a microscopic diameter.

To form a blind via hole with a laser, as shown in FIG. 4(a), an upper surface and a lower surface of an insulative substrate 95 are respectively coated by upper surface and lower surface metal foils 921, 922. An opening 920 is formed in the upper surface metal foil 921 in correspondence with a blind via hole formation portion 935, and a laser 94 is emitted toward the opening 920. The laser 94 forms an opening in the insulative substrate 95 at a position corresponding to the blind via hole formation portion 935 and forms a blind via hole 93 that extends to the lower surface metal foil 922. As shown in FIG. 4(b), after the formation of the blind via hole 93 is completed, chemical plating or electroplating is performed to form a metal plating film 923 on the wall of the blind via hole 93.

However, since the metal foil is thick in the conventional printed circuit board, etching must be performed under severe conditions, and etching takes time. Thus, the formation of the upper surface pattern through etching is difficult. This decreases work efficiency.

Accordingly, the thickness of the metal foil may be reduced. However, in this case, as shown in FIG. 4(x), the thickness of the lower surface metal foil 922 is reduced, the laser 94 may inflict damage 929 on the lower surface metal foil 922.

It is an object of the present invention to provide a printed circuit board and method of manufacturing same that facilitate the formation of the upper surface pattern and prevent a laser from damaging the lower metal foil when forming blind via holes.

SUMMARY OF THE INVENTION

A first embodiment according to the present invention proposes a method for manufacturing a printed circuit board. The method includes the steps of coating a lower surface and an upper surface of an insulative substrate, respectively, with a lower surface metal foil and an upper surface metal foil, the thickness of which is less than that of the lower surface metal foil, forming an opening in the upper surface metal foil at a portion corresponding to a blind via hole formation portion of the insulative substrate, forming a blind via hole, the bottom of which is the lower surface metal foil, by emitting a laser against the blind via hole formation portion through the opening, applying a conductor to the blind via hole, and forming an upper surface pattern and a lower surface pattern by respectively etching the upper surface metal foil and the lower surface metal foil.

The thickness of the upper surface metal foil is less than the thickness of the lower surface metal foil. This facilitates etching of the upper surface pattern, and the thickness of the lower surface metal foil is such that the lower surface metal foil is prevented from being damaged by the emission of a laser during formation of the blind via hole. Accordingly; the upper pattern is easily formed through etching, damage to the lower surface pattern due to the laser emission is prevented, and a conductor is applied to the blind via hole in a satisfactory state.

When making the upper surface metal foil thinner than the lower surface metal foil, after both surfaces of the insulative substrate are respectively coated with an upper surface metal foil and a lower surface metal foil that have the same thickness, it is preferred that etching be performed on the upper surface metal foil to remove part of the upper surface metal foil. In this manner, by performing etching in a single step, the formation of the thin upper surface metal foil is facilitated.

Alternatively, when making the upper surface metal foil thinner than the lower surface metal foil, after both surfaces of the insulative substrate are respectively coated with an upper surface metal foil and a lower surface metal foil that have the same thickness, a metal plating film may further be applied to the surface of the lower metal foil.

It is preferred that the thickness of the upper surface pattern be 2 to 12 $\mu$m. When thinner than 2 $\mu$m, the strength of the upper pattern may be insufficient. When thicker than 12 $\mu$m, etching may be difficult during the formation of the upper surface pattern.

It is preferred that the thickness of the lower surface pattern be 15 to 25 $\mu$m. When thinner than 15 $\mu$m, the lower surface pattern, which defines the bottom of the blind via hole, may be damaged by the laser emission. Further, there is no benefit to making the thickness greater than 25 $\mu$m.

To apply a conductor to the via hole, for example, chemical plating and electroplating may be performed to form a metal plating film on the wall of the via hole or the interior of the via hole may be filled with a conductive material, such as solder. However, other methods may be employed to apply a conductor.

A resin material, such as epoxy, polyimide, and bismaleimidetriazine, or a filler-containing multiple resin substrate made of these resin materials in addition to glass cloth and glass filler may be used as the insulative substrate.

The upper surface metal foil and the lower surface metal foil may, for example, both be made of copper foil, although other materials may be used.

In the above manufacturing method, the upper surface pattern and the lower surface pattern are formed after applying a conductor to the blind via hole. However, the upper surface pattern and the lower surface pattern may be formed before forming the blind via hole.

That is, in a second embodiment according to the present invention, a method for manufacturing a printed circuit board includes the steps of coating a lower surface and an upper surface of an insulative substrate respectively with a lower surface metal foil and an upper surface metal foil the thickness of which is less than that of the lower surface metal foil and forming an upper surface pattern and a lower surface pattern by respectively etching the upper surface metal foil and the lower surface metal foil. The upper surface pattern has an opening exposing the upper surface of the insulative substrate at a portion corresponding to a blind via hole formation portion. The lower surface pattern covers the lower surface of the insulative substrate at a portion corresponding to the blind via hole formation portion. The method further includes the steps of forming a blind via hole, the bottom of which is the lower surface pattern, by emitting a laser against the insulative substrate through the opening, and applying a conductor to the blind via hole.

The manufacturing method of the second embodiment obtains the same effects as the manufacturing method of the first aspect. The details are the same as the manufacturing method of the first embodiment.

A third embodiment provides a printed circuit board obtained through the manufacturing method of the first or second embodiments. The printed circuit board includes an insulative substrate, an upper surface pattern and a lower surface pattern provided, respectively, on an upper surface and a lower surface of the insulative substrate, and a blind via hole for electrically connecting the upper surface pattern and the lower surface pattern. An upper portion of the blind via hole is opened and a bottom of the blind via hole is covered by the lower surface pattern. The thickness of the upper surface pattern is less than that of the lower surface pattern.

The upper surface pattern is thinner than the lower surface pattern. Thus, when manufacturing the printed circuit board, etching for forming the upper surface pattern is facilitated. Further, the lower surface pattern, which defines the bottom of the blind via hole, is not damaged by the laser emission, and the blind via hole is formed in a satisfactory state.

BRIEF DESCRIPTION OF THE DRAWINGS

FIG. 2 is a schematic cross-sectional view showing a printed circuit board according to an embodiment of the present invention;

DETAILED DESCRIPTION OF

A printed circuit board according to an embodiment of the present invention will now be described with reference to FIGS. 1 to 4.

Figure 1:
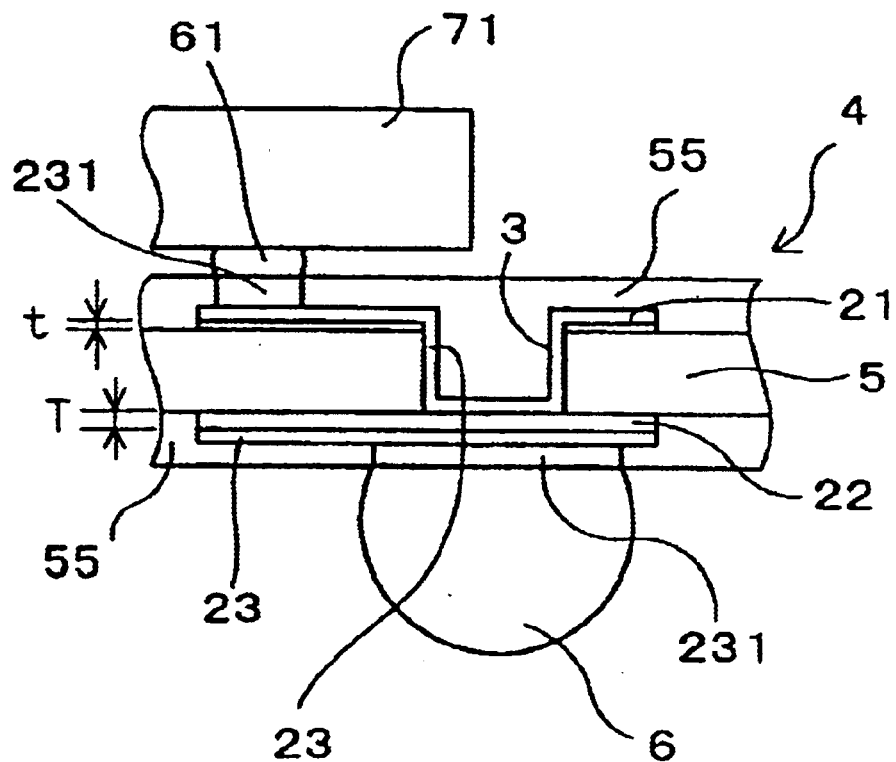
FIG. 1 is a schematic cross-sectional view showing a printed circuit board according to an embodiment of the present invention.

As shown in FIGS. 1 and 2, a printed circuit board 4 includes an insulative substrate 5, an upper surface pattern 21 formed on the upper surface of the insulative substrate 5, a lower surface pattern 22 formed on the lower surface of the insulative substrate 5, and blind via holes 3 electrically connecting the upper surface pattern 21 and the lower surface pattern 22. The upper portions of the blind via holes 3 are opened, and the lower portions of the blind via holes 3 ape covered by the lower surface pattern 22.

As shown in FIG. 1, the thickness t of the upper surface pattern 21 is less than the thickness T of the lower surface pattern 22. The difference between the thickness T of the lower surface pattern 22 and the thickness t of the upper surface pattern 21 is substantially the same as the thickness of the plating applied to the blind via holes and is about 3 to 10 $\mu$m.

The surfaces of the upper surface pattern 21 and the lower surface pattern 22 and the walls of the blind via holes 3 are coated by a metal plating film 23. The surface of the insulative substrate 5, including the interiors of the blind via holes 3, is coated with a solder resist 55. Connection balls 61, which are connected to an electronic component 71, are adhered to the upper surface pattern 21 via a metal plating film 231. Further, solder balls 6, which are used to arrange the printed circuit board 4 on an external substrate, are adhered to the lower surface pattern 22 via a metal plating film 231.

A method for manufacturing the printed circuit board will now be described.

Figure 3A:
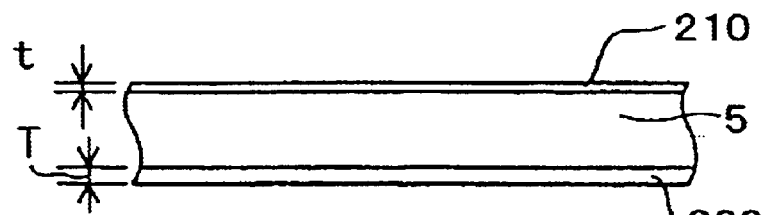
FIGS. 3(a) to 3(i) are explanatory diagrams illustrating a method for manufacturing a printed circuit board according to an embodiment of the present invention.

Referring to FIG. 3(a), a glass epoxy substrate, which is used as the insulative substrate 5, is first prepared. Then, the upper and lower surfaces of the insulative substrate 5 are respectively coated by an upper surface metal foil 210 and a lower surface metal foil 220. The thickness t of the upper surface metal foil 210 is less than the thickness T of the lower surface metal foil 220. It is preferred that the coating of the upper surface metal foil 210 and the lower surface metal foil 220 be substances having thicknesses t and T, respectively. As an alternative example, a surface treatment, such as sandblasting, may be performed to adjust the thickness of the upper surface metal foil so that the thickness t of the upper surface metal foil 210 becomes less than the thickness T of the lower surface metal foil 220. Further, upper surface and lower surface metal foils having the same thickness may be respectively applied to the upper surface and lower surface of the insulative substrate 5, and the upper surface metal foil may be etched until it is reduced to the thickness t to form the upper surface metal foil 210. The upper surface metal foil 210 and the lower surface metal foil 220 are preferably copper foils.

Figure 3B:
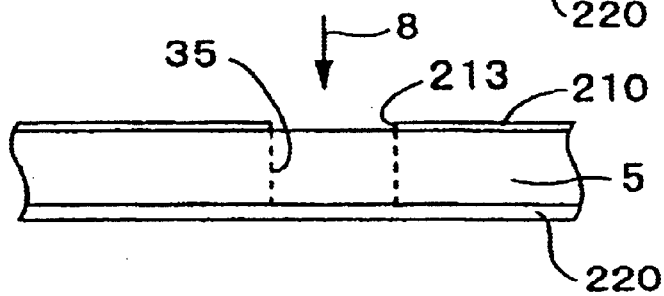

Then, as shown in FIG. 3(b), a portion of the upper surface metal foil 210 corresponding to a blind via hole formation portion 35 of the insulative substrate 5 is etched to form an opening 213.

Figure 3C:
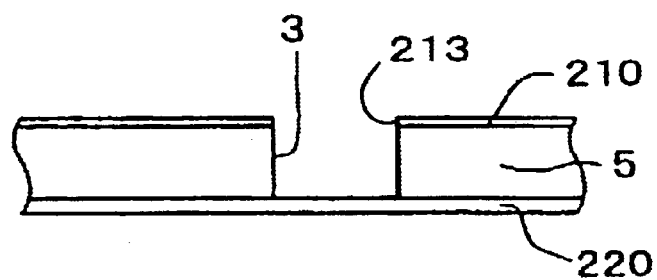

Then, a laser 8 is emitted against the surface of the surface of the insulative substrate 5 exposed by the opening 213, or the blind via hole formation portion 35. This forms the blind via hole 3, the bottom of which is the lower surface metal foil 220, as shown in FIG. 3(c).

Figure 3D:
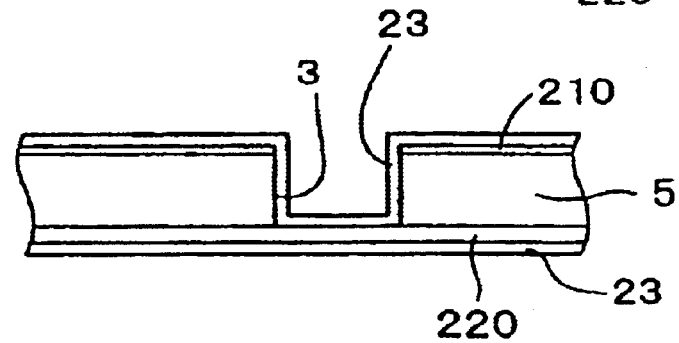

Then, with reference to FIG. 3(d), a chemical copper plating and an electric copper plating are applied to the wall of the blind via hole 3 to form the metal plating film 23. The surfaces of the upper surface metal foil 210 and the lower surface metal foil 220 are also coated by the metal plating, film 23.

Figure 3E:
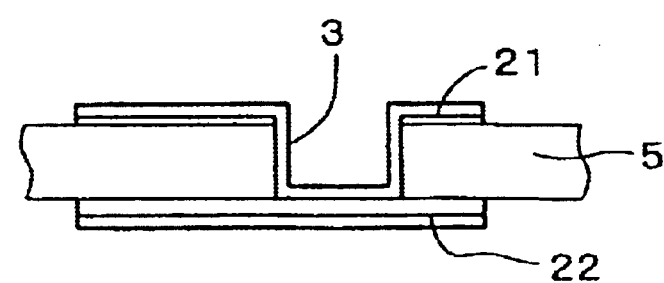

Then, with reference to FIG. 3(e), the upper surface metal foil 210 and the lower surface metal foil 220 are etched to form the upper surface pattern 21 and the lower surface pattern 22.

Figure 3F:
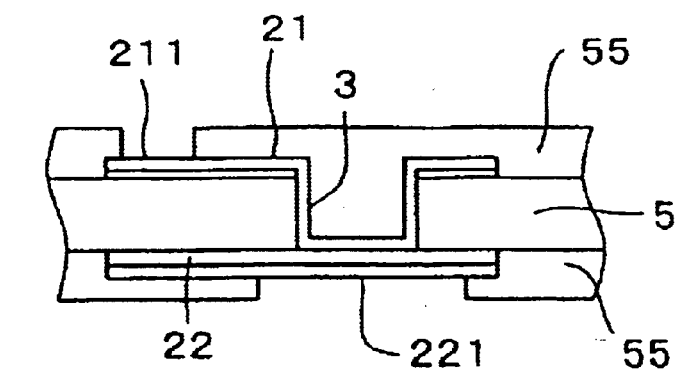

Then, with reference to FIG. 3(f), the solder resist 55 is applied to the upper surface and lower surface of the insulative substrate 5. The solder resist 55 is applied so that a connection ball adhering portion 211 of the upper surface pattern 21 and a solder ball adhering portion 221 of the lower surface pattern 22 are exposed.

Figure 3G:
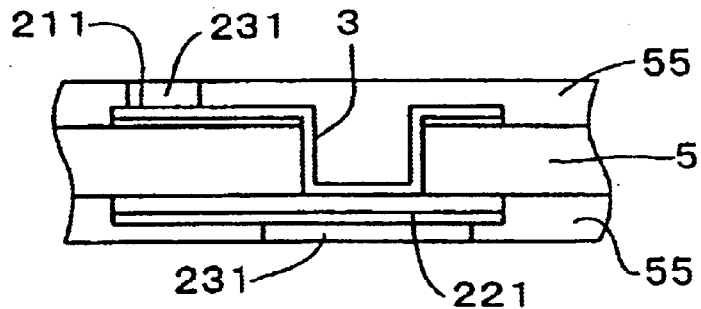

Then, as shown in FIG. 3(g), a metal plating film 231, which is formed from nickel and gold, is applied to the connection ball adhering portion 211 of the upper surface pattern 21 and the solder ball adhering portion 221 of the lower surface pattern 22.

Figure 3H:
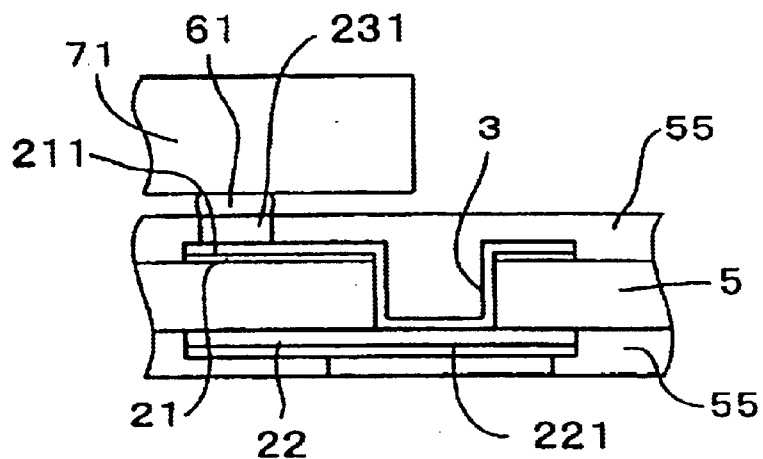

Then, as shown in FIG. 3(h), the electronic component 71 is adhered to the connection ball adhering portion 211 of the upper surface pattern 21 by the connection ball 61, which is formed from solder.

Figure 3I:
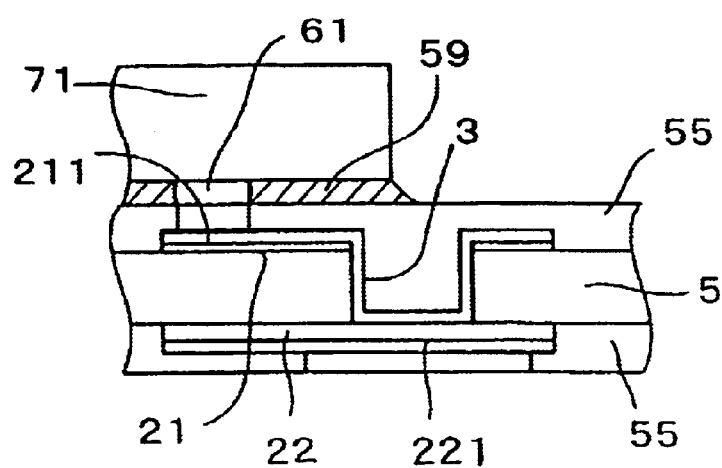
Figure 4A:
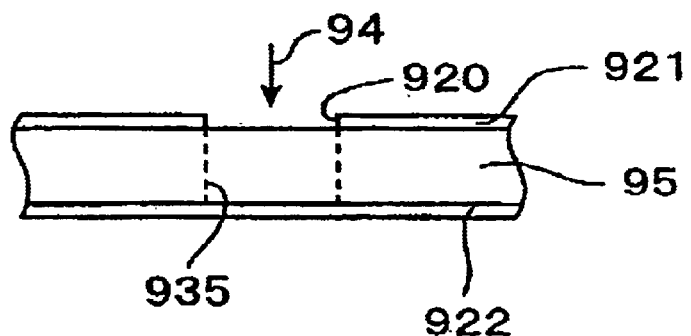
FIGS. 4(a)–(x) are explanatory views showing a method for manufacturing prior examples of printed circuit boards.
Figure 4B:
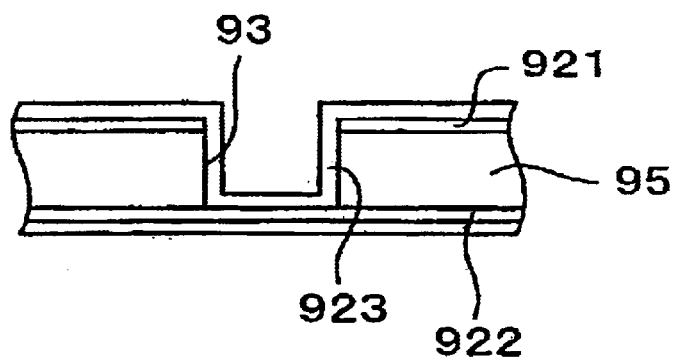
Figure 4X:
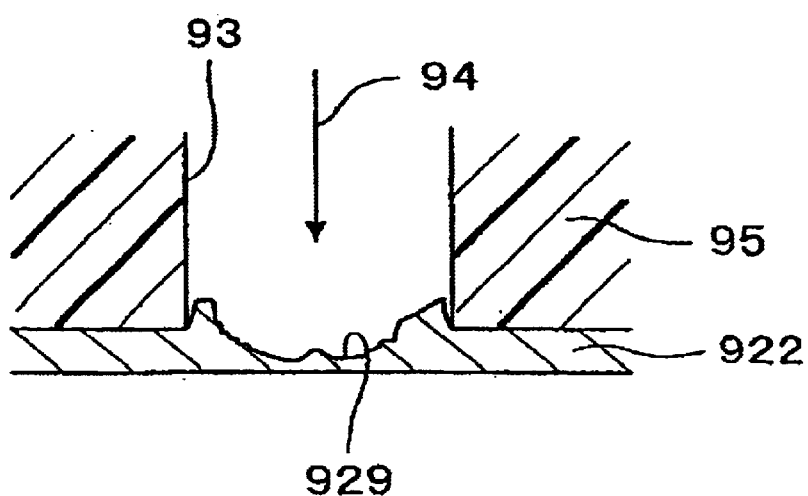

Then, as shown in FIG. 3(i), under filling is performed using a filling material 59, such as an epoxy resin.

The printed circuit board 4 of FIGS. 1 and 2 is manufactured as described above.

The operation and advantages of the present embodiment will now be discussed.

In the printed circuit board manufacturing method according to the present embodiment, the thickness t of the upper surface metal foil 210 is less than the thickness T of the lower surface metal foil 220. Thus, with reference to FIG. 3(*e*), this facilitates etching when etching the thin upper surface metal foil 210 to form the upper surface pattern 21. Further, as shown in FIG. 3(*b*), the thick lower surface metal foil 220 is not damaged by the emission of the laser 8 during formation of the blind via hole.

Accordingly, the manufacturing method of the present embodiment enables the upper surface pattern 21 to be easily formed through etching. Further, the lower surface pattern 22, which is the bottom of the blind via hole, is prevented from being damaged by the laser emission during formation of the blind via hole, and a conductor is applied to the blind via hole 3 in a satisfactory state.

What is claimed is:

1. A method for manufacturing a printed circuit board comprising the steps of:
    coating a lower surface and an upper surface of an insulative substrate respectively with a lower surface metal foil and an upper surface metal foil, the thickness of which is less than that of the lower surface metal foil;
    forming an opening in the upper surface metal foil at a location corresponding to a blind via hole formation portion of the insulative substrate;
    forming a blind via hole, the bottom of which is the lower surface metal foil, by emitting a laser against the blind via hole formation portion through the opening;
    applying a conductor to the blind via hole; and
    forming an upper surface pattern and a lower surface pattern by respectively etching the upper surface metal foil and the lower surface metal foil, wherein the upper surface and lower surface metal foil coating step includes a step of coating the upper surface and the lower surface, respectively, with an upper surface metal foil and a lower surface metal foil that have the same thickness, and a step for etching the upper surface metal foil.

2. The printed circuit board manufacturing method according to claim 1, wherein the thickness of the upper surface pattern is 2 to 12 $\mu$m.

3. The printed circuit board manufacturing method according to claim 1, wherein the thickness of the lower surface pattern is 15 to 25 $\mu$m.

4. A method for manufacturing a printed circuit board comprising the steps of:
    coating a lower surface and an upper surface of an insulative substrate respectively with a lower surface metal foil and an upper surface metal toil, the thickness of which is less than that of the lower surface metal foil;
    forming an opening in the upper surface metal foil at a location corresponding to a blind via hole formation portion of the insulative substrate;
    forming a blind via hole, the bottom of which is the lower surface metal foil, by emitting a laser against the blind via hole formation portion through the opening;
    applying a conductor to the blind via hole; and
    forming an upper surface pattern and a lower surface pattern by respectively etching the upper surface metal foil and the lower surface metal foil, wherein the upper surface and lower surface metal foil coating step includes a step for coating the upper surface and the lower surface, respectively, with an upper surface metal foil and a lower surface metal foil that have the same thickness, and a step for performing a sandblast treatment to the upper surface metal foil so that the thickness of the upper surface metal foil becomes less that of the lower surface metal foil.

5. The printed Circuit board manufacturing method according to claim 4, wherein the thickness of the upper surface pattern is 2 to 12 $\mu$m.

6. The printed Circuit board manufacturing method according to claim 4, wherein the thickness of the lower surface pattern is 15 to 25 $\mu$m.

7. A method for manufacturing a printed circuit board comprising the steps of:
    coating a lower surface and an upper surface of an insulative substrate respectively with a lower surface metal foil and an upper surface metal foil, the thickness of which is less than that of the lower surface metal foil;
    forming an upper surface pattern and a lower surface pattern by respectively etching the upper surface metal foil and the lower surface metal foil, wherein the upper surface pattern has an opening exposing the upper surface of the insulative substrate at a location corresponding to a blind via hole formation portion, and the lower surface pattern covers the lower surface of the insulative substrate at a location corresponding to the blind via hole formation portion;
    forming a blind via hole, the bottom of which is the lower surface pattern, by emitting a laser against the insulative substrate through the opening; and
    applying a conductor to the blind via hole wherein the upper surface end lower surface metal foil coating step includes a step of coating the upper surface and the lower surface, respectively, with an upper surface metal foil and a lower surface metal foil that have the same thickness, and a step for etching the upper surface metal foil.

8. The printed circuit board manufacturing method according to claim 7, wherein the thickness of the upper surface pattern is 2 to 12 $\mu$m.

9. The printed circuit board manufacturing method according to claim 7, wherein the thickness of the lower surface pattern is 15 to 25 $\mu$m.

10. A method for manufacturing a printed circuit board comprising the steps of:
    coating a lower surface and an upper surface of an insulative substrate respectively with a lower surface metal foil and, an upper surface metal foil, the thickness of which is less than that of the lower surface metal foil;
    forming an upper surface pattern and a lower surface pattern by respectively etching the upper surface metal foil and the lower surface metal foil, wherein the upper surface pattern has an opening exposing the upper surface of the insulative substrate at a location corresponding to a blind via hole formation portion, and the lower surface pattern covers the lower surface of the insulative substrate at a location corresponding to the blind via hole formation portion;
    forming a blind via hole, the bottom of which is the lower surface pattern, by emitting a laser against the insulative substrate through the opening; and
    applying a conductor to the blind via hole, wherein the upper surface and lower surface metal foil coating step includes a step for coating the upper surface and the lower surface, respectively, with an upper surface metal foil and a lower surface metal foil that have the same thickness, and a step for performing a sandblast treatment to the upper surface metal foil so that the thickness of the upper surface metal foil becomes less that of the lower surface metal foil.

11. The printed circuit board manufacturing method according to claim 10, wherein the thickness of the upper surface pattern is 2 to 12 μm.

12. The printed circuit board manufacturing method according to claim 10, wherein the thickness of the lower surface pattern is 15 to 25 μm.

* * * * *